United States Patent
Jeon et al.

(10) Patent No.: US 8,217,445 B2
(45) Date of Patent: *Jul. 10, 2012

(54) SONOS MEMORY DEVICE USING AN AMORPHOUS MEMORY NODE MATERIAL

(75) Inventors: Sang-hun Jeon, Yongin-si (KR);
Soo-doo Chae, Seongnam-si (KR);
Ju-hyung Kim, Yongin-si (KR);
Chung-woo Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1457 days.

This patent is subject to a terminal disclaimer.

(21) Appl. No.: 10/864,499

(22) Filed: Jun. 10, 2004

(65) Prior Publication Data

US 2004/0251489 A1 Dec. 16, 2004

(30) Foreign Application Priority Data

Jun. 10, 2003 (KR) .................. 10-2003-0037136
Sep. 9, 2003 (KR) .................. 10-2003-0063362

(51) Int. Cl.
*H01L 29/792* (2006.01)
(52) U.S. Cl. ....................... 257/324; 257/411
(58) Field of Classification Search ............ 257/324, 257/411

See application file for complete search history.

(56) References Cited

U.S. PATENT DOCUMENTS

| | | | |
|---|---|---|---|
| 5,640,345 A * | 6/1997 | Okuda et al. ............... 365/184 | |
| 6,291,867 B1 | 9/2001 | Wallace et al. | |
| 6,613,658 B2 * | 9/2003 | Koyama et al. ............ 438/591 | |
| 6,825,538 B2 * | 11/2004 | Frank et al. ............... 257/411 | |
| 6,858,906 B2 * | 2/2005 | Lee et al. ................. 257/406 | |
| 6,936,884 B2 * | 8/2005 | Chae et al. ............... 257/315 | |
| 7,053,448 B2 * | 5/2006 | Jeon et al. ............... 257/324 | |
| 2002/0089023 A1 | 7/2002 | Yu et al. | |
| 2002/0115252 A1 | 8/2002 | Haukka et al. | |
| 2002/0149065 A1 | 10/2002 | Koyama et al. | |
| 2002/0190302 A1 | 12/2002 | Bojarczuk, Jr. et al. | |
| 2003/0047755 A1 | 3/2003 | Lee et al. | |
| 2004/0069990 A1 | 4/2004 | Mahajani et al. | |

FOREIGN PATENT DOCUMENTS

DE 102 28 768 1/2003
KR 10-2005-0070806 7/2005

OTHER PUBLICATIONS

Robertson, John, "Band offsets of wide-band-gap oxides and implications for future electronic devices", J. Vac. Sci. Technol. B 18(3):1785-171791 (May/Jun. 2000).

* cited by examiner

*Primary Examiner* — Howard Weiss

(74) *Attorney, Agent, or Firm* — Lee & Morse, P.C.

(57) ABSTRACT

A SONOS memory device, and a method of manufacturing the same, includes a substrate and a multifunctional device formed on the substrate. The multifunctional device performs both switching and data storing functions. The multifunctional device includes first and second impurities areas, a channel formed between the first and second impurities areas, and a stacked material formed on the channel for data storage. The stacked material for data storage is formed by sequentially stacking a tunneling oxide layer, a memory node layer in which data is stored, a blocking layer, and an electrode layer.

21 Claims, 7 Drawing Sheets

SONOS MEMORY DEVICE USING AN AMORPHOUS MEMORY NODE MATERIAL

BACKGROUND OF THE INVENTION

1. Field of the Invention

The present invention relates to a semiconductor memory device and manufacturing method. More particularly, the present invention relates to a SONOS memory device with enhanced thermal stability and a method of manufacturing the same.

2. Description of the Related Art

A unit memory cell in a semiconductor memory device, e.g., a dynamic random access memory (DRAM), includes one transistor and one capacitor. Therefore, the size of a transistor and/or a capacitor should be reduced in order to enhance a degree of integration.

In a manufacturing process for an early semiconductor memory device, a photo and etching process provided a sufficient process margin. Thus, the degree of integration was not important. In addition, the degree of integration was enhanced to some extent by reducing the size of other components forming the semiconductor memory device.

However, as the demand for semiconductor memory devices having a high degree of integration has increased, a new method to enhance the degree of integration in semiconductor memory devices has been required.

The degree of integration of a semiconductor memory device is directly related to a design rule. Thus, since the design rule has to be more strictly maintained in order to enhance the degree of integration, the margin of the photo and etching process may be very narrow. Accordingly, the photo and etching process has to be more accurately performed.

The narrow margin of the photo and etching process results in low yield. Thus, a new method not only for enhancing the degree of integration, but also for preventing low yield, has been required.

A semiconductor memory device that addresses this problem has a totally different structure from a conventional one. More specifically, it has a data storing medium above a transistor, such as a giant magneto-resistance (GMR) or tunneling magneto-resistance (TMR) medium, which performs different storing operations than a conventional capacitor.

A silicon oxide nitride oxide silicon (SONOS) memory device is one of these semiconductor memory devices. FIG. 1 illustrates a cross-sectional view of a conventional SONOS memory device (hereinafter, "the conventional memory device").

Referring to FIG. 1, the conventional memory device includes a p-type substrate 10 (hereinafter, "the substrate") having a source area 12 in which n-type conductive impurities are injected, a drain area 14, and a channel area 16 formed between the source and drain areas 12 and 14. A gate stack material 30 is formed on the channel area 16 of the substrate 10. The gate stack material 30 is formed by sequentially stacking a tunneling oxide layer 18, a silicon nitride ($Si_3N_4$) layer 20, a blocking oxide layer 22, and a gate electrode 24. Here, the tunneling oxide layer 18 and the blocking oxide layer 22 are silicon oxide ($SiO_2$). The tunneling oxide layer 18 comes in contact with the source and drain areas 12 and 14. The $Si_3N_4$ layer 20 has a trap site having a predetermined density. Therefore, when a predetermined voltage is applied to the gate electrode 24, electrons which pass through the tunneling oxide layer 18 are trapped in the trap site of the $Si_3N_4$ layer 20. The blocking oxide layer 22 blocks electrons from moving to the gate electrode 24 when the electrons are trapped in the trap site of the $Si_3N_4$ layer 20.

The conventional memory device has a different threshold voltage depending on whether the electrons are trapped in the trap site of the $Si_3N_4$ layer 20. By using this feature, the conventional memory device can save and read information. However, the conventional memory device not only has a long data erasing time, but also has a short retention time, i.e., a time during which saved data is properly maintained.

To solve the above problems, a SONOS memory device in which the $Si_3N_4$ layer 20, i.e., a trapping layer, is replaced with a hafnium oxide ($HfO_2$) layer having high permittivity and the blocking layer 22 is replaced with an aluminum oxide ($Al_2O_3$) layer, has been suggested.

However, while a crystallization temperature of most of a metal oxide layer having high permittivity is 700° C.~800° C., a temperature of general metal oxide semiconductor (MOS) processes, e.g., a process to activate conductive impurities which are injected into the source and drain areas 12 and 14, is over 900° C. Given this fact, when the $Si_3N_4$ layer 20 and the blocking oxide layer 22 are replaced with metal oxide layers having high permittivity, it is not possible to prevent the crystallization of these metal oxide layers during general MOS processes. This crystallization of metal oxide layers having high permittivity presents the following problems.

First, the surface roughness of a trapping layer of crystallized metal oxide is large. Thus, an effective distance between the metal oxide layers used as the trapping layer and the blocking oxide layer is not constant. This degrades a retention characteristic.

Second, the density of the trap site of the trapping layer is highest when the trapping layer is in an amorphous substance. However, if the trapping layer is crystallized, the density of the trap site of the trapping layer is lowered and the characteristic of the trapping layer serving as a memory node layer is degraded.

Third, materials forming the metal oxide layer having high permittivity used as the trapping layer, e.g., a $HfO_2$ layer, and used as the blocking oxide layer, e.g., an $Al_2O_3$ layer, are mixed together during general MOS processing at temperatures over 900° C. As a result, it is difficult to distinguish boundaries between the trapping and blocking layers.

Fourth, thermal instability occurs. This thermal instability can be seen by referring to FIG. 2. FIG. 2 is a graph illustrating a problem in a SONOS memory device including a metal oxide (MO) stack for low voltage operations, which is suggested as an alternative to the SONOS memory device of FIG. 1

Referring to FIG. 2, the first graph G1 illustrates a current-voltage characteristic shortly after sequentially forming $HfO_2$ and $Al_2O_3$ layers on a tunneling oxide layer, which is still a $SiO_2$ layer. The second graph G2 illustrates a current-voltage characteristic measured after sequentially forming the $HfO_2$ and $Al_2O_3$ layers on the tunneling oxide layer and annealing these layers at a temperature of 900° C. That is, the first graph G1 shows the current-voltage characteristic before the crystallization of the $HfO_2$ and $Al_2O_3$ layers and the second graph G2 shows the current-voltage characteristic after the crystallization of the $HfO_2$ and $Al_2O_3$ layers.

Comparing the first and second graphs G1 and G2, the current-voltage characteristics before and after the crystallization of the $HfO_2$ and $Al_2O_3$ layers are different. Particularly, the first graph G1 is greatly distorted as a gate voltage Vg approaches 1V, while the second graph G2 is much less so. These differences arise because thermal stability before and after the crystallization is not guaranteed.

SUMMARY OF THE INVENTION

The present invention is therefore directed to a SONOS memory device, and method of manufacture thereof, which substantially overcomes one or more of the problems due to the limitations and disadvantages of the related art.

It is a feature of an embodiment of the present invention to provide a SONOS memory device, and method of manufacture thereof, which properly maintains a retention characteristic. It is another feature of an embodiment of the present invention to provide a SONOS memory device, and method of manufacture thereof, that maintains a trapping layer, i.e., a memory node layer, in an amorphous state during a MOS process, which is carried out at a high temperature.

At least one of the above and other features and advantages of the present invention may be realized by providing a silicon-oxide-nitride-oxide-silicon (SONOS) memory device, including a substrate and a multifunctional device formed on the substrate, the multifunctional device providing switching and data storing functions.

The multifunctional device may include first and second impurities areas, a channel formed between the first and second impurities areas, and a stacked material formed on the channel for data storage, wherein the first and second impurities areas and the channel are formed on the substrate. The stacked material for data storage may be formed by sequentially stacking a first tunneling oxide layer, a memory node layer in which data is stored, a first blocking layer, and an electrode layer.

A second tunneling oxide layer may be further formed between the first tunneling oxide layer and the memory node layer. A second blocking layer may be further formed between the first blocking layer and the electrode layer.

The memory node layer may be an M-oxide-nitride (MON) or an M-silicon-oxide-nitride (MSiON) layer, wherein M is a metal material. The first tunneling oxide layer may be a silicon oxide ($SiO_2$) layer. The second tunneling oxide layer may be an aluminum oxide ($Al_2O_3$) layer. The first blocking layer may be an $Al_2O_3$ or $SiO_2$ layer. The second blocking layer may be a hafnium oxide ($HfO_2$), zirconium oxide ($ZrO_2$), tantalum oxide ($Ta_2O_5$) or titanium oxide ($TiO_2$) layer. The M may be hafnium (Hf), zirconium (Zr), tantalum (Ta), titanium (Ti), aluminium (Al), or a lanthanide (Ln), where the Ln is lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu). The MON or MSiON layer may contain nitrogen (N) of about 1 atomic %~80 atomic %.

At least one of the above and other features and advantages of the present invention may be realized by providing a method of manufacturing a silicon-oxide-nitride-oxide-silicon (SONOS) memory device having a substrate and a memory type transistor which includes a gate stack formed on the substrate for data storage, wherein formation of the gate stack includes sequentially forming a first tunneling oxide layer, a metal oxide and nitride material layer in which data is stored, a first blocking layer, and a conductive layer on the substrate; forming a mask on a predetermined area of the conductive layer; sequentially etching the conductive layer, the first blocking layer, the metal oxide and nitride material layer, and the first tunneling oxide layer around the mask; and removing the mask.

The sequentially forming the first tunneling oxide layer, the metal oxide and nitride material layer, the first blocking layer, and the conductive layer on the substrate may further include forming a second tunneling oxide layer between the first tunneling oxide layer and the metal oxide and nitride material layer. The sequentially forming the first tunneling oxide layer, the metal oxide and nitride material layer, the first blocking layer, and the conductive layer on the substrate may further include forming a second blocking layer between the first blocking layer and the conductive layer.

The first tunneling oxide layer may be formed of a $SiO_2$ layer. The second tunneling oxide layer may be formed of an $Al_2O_3$ layer. The first blocking layer may be formed of an $Al_2O_3$ or $SiO_2$ layer. The second blocking layer may be formed of a $HfO_2$, $ZrO_2$, $Ta_2O_5$ or $TiO_2$ layer.

The metal oxide and nitride material layer may be formed by an atomic layer chemical vapor deposition (ALCVD), CVD, a low pressure CVD (LCVD), plasma enhanced CVD (PECVD) or reactive sputtering method. The metal oxide and nitride material layer may be formed of an M-oxide-nitride (MON) or an M-silicon-oxide-nitride (MSiON), wherein M is a metal material. The M may be Hf, Zr, Ta, Ti, Al, or Ln. The Ln may be La, Ce, Pr, Nd, Sm, Eu, Gd, Tb, Dy, Ho, Er, Tm, Yb, or Lu.

The MON and MSiON layer may be respectively formed by forming MO and MSiO layers and then nitriding the MO and MSiO layers. The nitrided layers may then be oxidized. The MO and MSiO layers may be nitrided using a plasma processing with a nitrogen ($N_2$) or an ammonia ($NH_3$) gas, a rapid thermal annealing (RTA) with an $NH_3$ gas, a furnace processing with an $NH_3$ gas, or a nitrogen ion injecting method. If the RTA or the furnace is used, a process temperature may be in a range of about 200° C.~1,300° C. The MO or MSiO layer may be nitrided such that the MO or MSiO layer contains N of about 1 atomic %~80 atomic %. If also oxidized, the oxidization may be performed using the furnace or the RTA having an oxygen gas at a temperature of 100° C.~1,300° C. The oxygen gas may be oxygen ($O_2$), water ($H_2O$), ozone ($O_3$) or nitrous oxide ($N_2O$).

The MON and MSiON layers may be respectively formed by forming MN and MSiN layers and then oxidizing the MN and MSiN layers. The oxidization may be performed using a furnace or a rapid thermal annealing (RTA) with an oxygen gas at a temperature of about 100° C.~1,300° C. The oxygen gas may be $O_2$, $H_2O$, $O_3$ or $N_2O$.

By using the SONOS memory device according to an embodiment of the present invention, the data programming and erasing time becomes much shorter than that of the conventional SONOS memory device. Thus, a data processing time is also much shorter. Further, an amorphous state of the memory node layer after MOS processing is maintained. Accordingly, problems related to the crystallization of the memory node layer, for instance, a decrease in a trap site density of the memory node layer, degradation of the retention characteristic due to an increase of the surface roughness, and mixing of materials forming the memory node layer and the blocking layer are prevented. Finally, the memory node layer is thermally stable.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
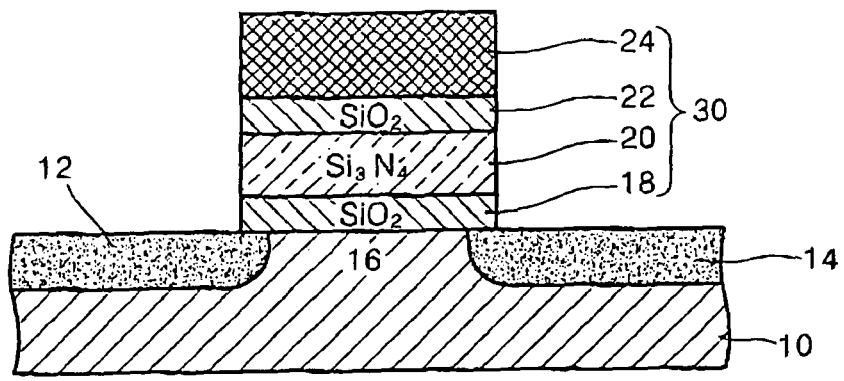
FIG. 1 illustrates a cross-sectional view of a conventional SONOS memory device.

Korean Patent Application No. 2003-37136, filed on Jun. 10, 2003, and No. 2003-63362, filed on Sep. 9, 2003, in the Korean Intellectual Property Office, and entitled: "SONOS Memory Device and Method of Manufacturing the Same," are both incorporated herein by reference in their entirety.

The present invention will now be described more fully with reference to the accompanying drawings in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

First, a silicon oxide nitride oxide silicon (SONOS) memory device will be explained.

Figure 3:
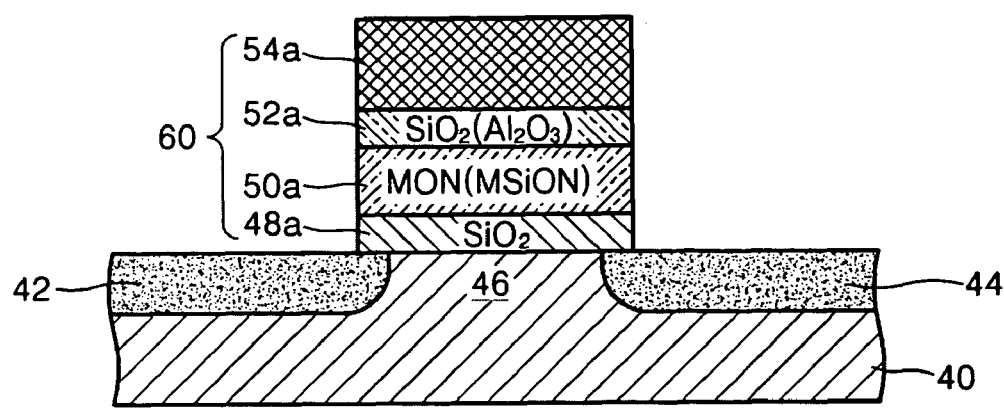
FIG. 3 illustrates a cross-sectional view of a SONOS memory device according to an embodiment of the present invention.

FIG. 3 illustrates a cross-sectional view of a SONOS memory device according to an embodiment of the present invention.

Referring to FIG. 3, a SONOS memory device includes a substrate 40, e.g., a p-type substrate, and first and second impurities areas 42 and 44 on the substrate 40. The first and second impurities areas 42 and 44 may be formed by ion-injecting predetermined conductive impurities, e.g., n-type conductive impurities, to a predetermined depth. The first and second impurities areas 42 and 44 are separated by a predetermined distance and a channel area 46, in which the predetermined conductive impurities are injected, is formed between the first and second impurities areas 42 and 44. That is, the channel area 46 extends from the first impurities area 42 to the second impurities area 44.

Hereinafter, the first and second impurities areas 42 and 44 are referred to as source and drain areas, respectively.

A gate stacked material for data storage 60 (hereinafter "the gate stacked material") is formed between the source and drain areas 42 and 44 on the substrate 40, i.e., on the channel area 46. The gate stack material 60 is formed by sequentially stacking a tunneling oxide layer 48a, a memory node layer 50a, a blocking layer 52a, and an electrode layer 54a. The tunneling oxide layer 48a contacts a top of the channel 46 and edges of the tunneling oxide layer 48a contact the source and drain areas 42 and 44. The tunneling area 48a may be a silicon oxide ($SiO_2$) layer, but other insulating layers may be used.

When an adequate voltage is applied to the electrode layer 54a, electrons which pass through the tunneling oxide layer 48a are trapped into the memory node layer 50a. A case where electrons are trapped into the memory node layer 50a corresponds to a case in which a datum "1" is stored. A case where electrons are not trapped into the memory node layer 50a corresponds to a case in which a datum "0" is stored. Since the memory node layer 50a is included in the gate stack material 60, the gate stacked material 60 can be regarded as a data storage type.

As described above, the memory node layer 50a is used as a trapping layer in which electrons are trapped, and thus, a trap site of the memory node layer 50a may have a high trap density. In addition, it is preferable that the memory node layer 50a is not crystallized in a metal oxide semiconductor (MOS) process at a temperature of over 900° C. Given this fact, it is preferable that the memory node layer 50a is an M-oxide-nitride (MON) or M-silicon-oxide-nitride (MSiON) layer. Both of the MON and MSiON layers are amorphous materials and contain nitrogen (N) of about 1 atomic %~80 atomic %. M of the MON and MSiON layers is a metal material such as hafnium (Hf), zirconium (Zr), tantalum (Ta), titanium (Ti), aluminium (Al), or a lanthanide (Ln). The Ln are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The blocking layer 52a blocks a carrier from moving between the memory node layer 50a and the electrode layer 54a, particularly, electrons trapped into the memory node layer 50a from moving to the electrode layer 54a. The blocking layer 52a may be an insulating layer having high permittivity, e.g., an aluminium ($Al_2O_3$) or $SiO_2$ layer. The electrode layer 54a may be formed of other conductive layers, e.g., a tungsten silicide layer.

In the meantime, the channel area 46 between the source and drain areas 42 and 44 is turned on or off according to a voltage applied to the electrode layer 54a of the gate stacked material 60. That is, a state of the channel area 46 can be switched by applying an adequate voltage to the electrode layer 54a. Therefore, the source and drain areas 42 and 44 and the gate stacked material 60 form a device having a switching function, e.g., a transistor. In addition, the gate stacked material 60 includes the memory node layer 50a in which data is stored. Thus, the device having a switching function also has a data storing function. As a result, the device including the source and drain areas 42 and 44 and the gate stacked material 60 becomes a multifunctional device having both switching and data storing functions. Although the multifunctional device can referred to as a transistor, it is more properly referred to as a data storing or memory type transistor, since the multifunctional device can perform both switching and data storing functions.

Figure 4:
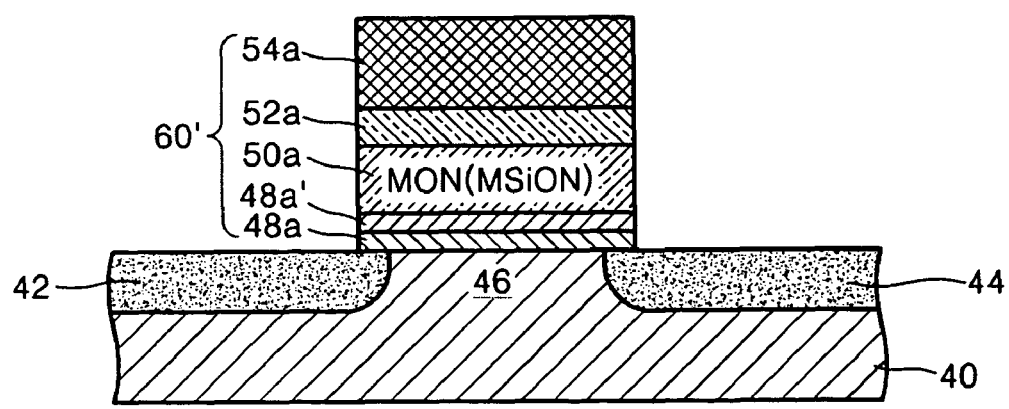
FIG. 4 illustrates a cross-sectional view of the SONOS memory device of FIG. 3 in which a tunneling insulating layer is formed of double layers.

FIG. 4 illustrates a cross-sectional view of the SONOS memory device of FIG. 3 in which a tunneling insulating layer is formed of two layers.

Referring to FIG. 4, a second tunneling oxide layer 48a' may be further formed between the first tunneling oxide layer 48a and the memory node layer 50a. Accordingly, a gate stacked material 60' includes a double-layered tunneling oxide layer. The first tunneling oxide layer 48a may be a SiO$_2$ layer having a thickness of about 0.5 nm~1 nm and the second tunneling oxide layer 48a' may be an Al$_2$O$_3$ layer having a thickness of about 2 nm~5 nm.

Figure 5:
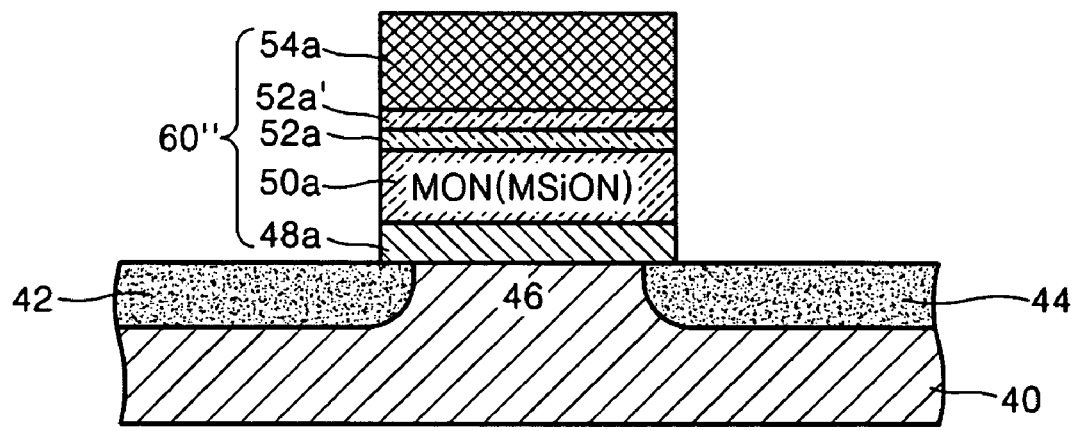
FIG. 5 illustrates a cross-sectional view of the SONOS memory device of FIG. 3 in which a blocking layer is formed of double layers.

FIG. 5 illustrates a cross-sectional view of the SONOS memory device of FIG. 3 in which a blocking layer is formed of two layers.

Referring to FIG. 5, a second blocking layer 52a' may be further formed between the first blocking layer 52a and the electrode layer 54a. That is, a double-layered blocking layer may be further formed between the memory node layer 50a and the electrode layer 54a. Accordingly, a gate stacked material 60" includes a double-layered blocking layer. The first blocking layer 52a may be an Al$_2$O$_3$ layer having a thickness of about 2 nm~4 nm and the second blocking layer 52a' may be an insulating layer having high permittivity and a thickness of about 3 nm~30 nm. The insulating layer having high permittivity may be formed of a hafnium oxide (HfO$_2$), zirconium oxide (ZrO$_2$), tantalum oxide (Ta$_2$O$_5$) or titanium oxide (TiO$_2$) layer.

Although not illustrated, a SONOS memory device including all components of FIGS. 4 and 5 may be also formed.

Operation of the SONOS memory device shown in FIGS. 3, 4 and 5 is explained as follows. Data is stored in the memory node layer 50a by respectively applying a gate voltage Vg to the gate stacked material through the electrode layer 54a and a drain voltage Vd to the drain area 44. The stored data is read by checking values of currents which flow between the source and drain areas 42 and 44 after applying a predetermined gate voltage (Vg'<Vg) to the gate stacked material and a predetermined drain voltage (Vd'<Vd) to the drain area 44.

A method of manufacturing the SONOS memory device will be outlined.

Figure 6:
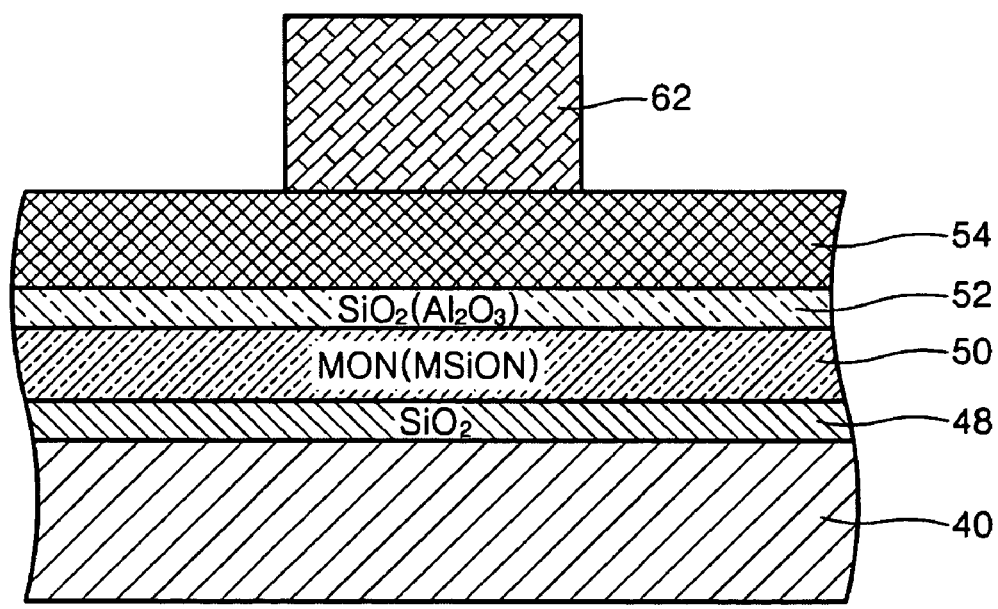
FIGS. 6 through 8 illustrate cross-sectional views of stages in a method of manufacturing the SONOS memory device of FIG. 3.
Figure 7:
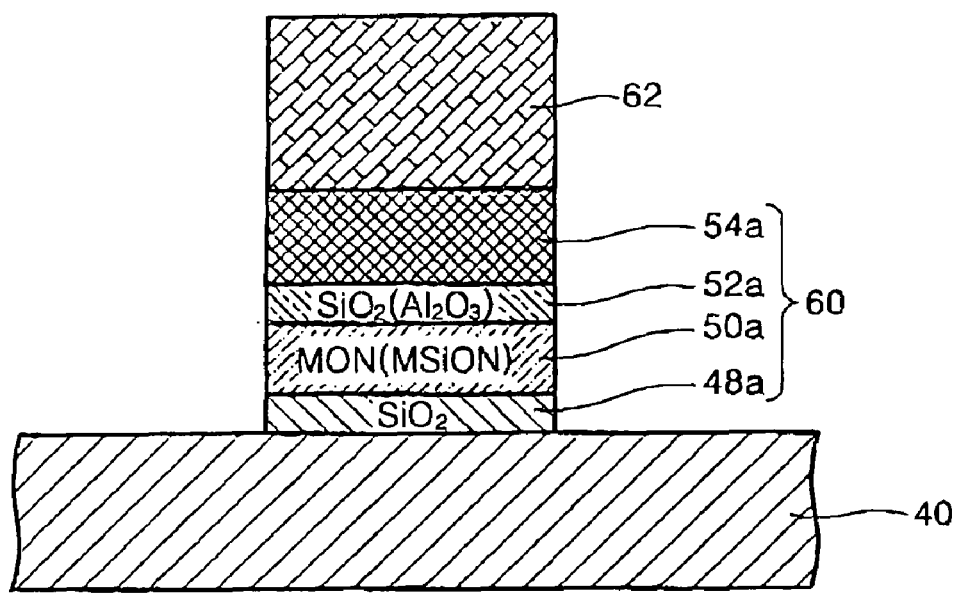
Figure 8:
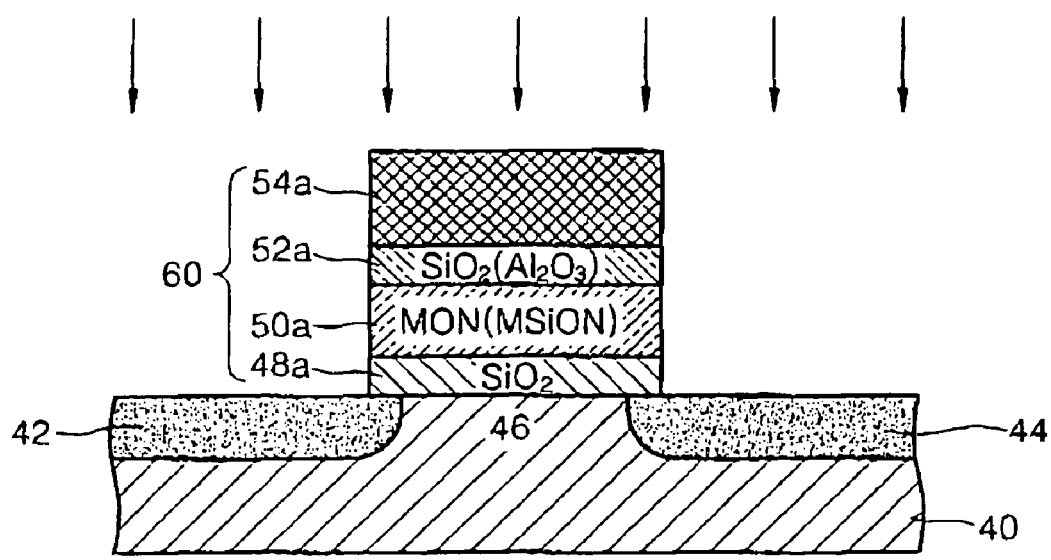

FIGS. 6 through 8 illustrate cross-sectional views of a method of manufacturing the SONOS memory device of FIG. 3.

Referring to FIG. 6, a first insulating layer 48, a memory node material layer 50, a second insulating layer 52, and a conductive layer 54 are sequentially formed on a substrate 40 which is doped with predetermined impurities, e.g., p-type impurities. Then, a photosensitive pattern 62 is formed in a predetermined area on top of the conductive layer 54. The photosensitive pattern is provided to limit an area in which a gate stack material will be formed. The first insulating layer 48 may be formed of single or double layers. If it is a single layer, the first insulating layer 48 may formed of a SiO$_2$ layer having a thickness of about 1.5 nm~4 nm. If it is a double layer, the first insulating layer 48 may be formed of a SiO$_2$ layer having a thickness of about 0.5 nm~1 nm and an Al$_2$O$_3$ layer having a thickness of about 2 nm~5 nm on the SiO$_2$ layer. The first insulating layer 48, formed of single or double layers, serves as a tunneling oxide layer. The memory node material layer 50 is formed of an MON or MSiON layer having a predetermined thickness. In the MON and MSiON layers, M is a metal material such as Hf, Zr, Ta, Ti, Al, or Ln. The Ln, or lanthanides, are La, Ce, Pr, Nd, Sm, Eu, Gd, Tb, Dy, Ho, Er, Tm, Yb, or Lu.

If the memory node material layer 50 is formed of the MON or MSiON layer, any of the following three methods may be used to form this layer.

A first method forms the MON or MSiON layer on the first insulating layer 48 through a single process. A second method forms an MO or MSiO layer on the first insulating layer 48 and then nitrides the MO or MSiO layer. A third method forms an MN or MSiN layer on the first insulating layer 48 and then oxidizes the MN or MSiN layer.

In the case of the first method, the MON or MSiON layer may be formed by an atomic layer chemical vapor deposition (ALCVD), CVD, a low pressure CVD (LPCVD), plasma enhanced CVD (PECVD), or a reactive sputtering method. However, other methods may be used.

In the case of the second method, the MO or MSiO layer may be nitrided by a plasma process using a nitrogen (N$_2$) or an ammonia (NH$_3$) gas, a rapid thermal annealing (RTA) using an NH$_3$ gas, a furnace processing with an NH$_3$ gas, or a nitrogen ion injecting process. When using the RTA or furnace processing, the temperature may be about 200° C.~1,300° C.

In the case of the third method, the oxidization may be performed at a temperature of about 100° C.~1,300° C. using the furnace processing or RTA with an oxygen gas. Here, oxygen (O$_2$), water (H$_2$O), ozone (O$_3$) or nitrous oxide (N$_2$O) may be used for providing the oxygen gas.

When forming the MON or MSiON layer, it is preferable that the MON or MSiON layer contains N of about 1 atomic %~80 atomic %.

According to an embodiment of the present invention, the MON or MSiON layer is formed by the second method, i.e., using the RTA process with the N gas or a rapid thermal nitridation (RTN) process. In this case, it is found that an amount of N injected into the MON or MSiON layer varies depending on a manufacturing temperature. Accordingly, a hysteresis characteristic of the SONOS memory device may be controllably changed. The comparison of temperature used for such formation and the resultant hysteresis is as follows.

TABLE 1

| Condition of Manufacturing Process | Hysteresis (mV) |
|---|---|
| RTN 700° C. | 75 |
| RTN 800° C. | 120 |
| RTN 900° C. | 150 |

As can be seen in Table 1, as the manufacturing temperature increases, the hysteresis also increases. This indicates that as the manufacturing temperature increases, more N is injected into the MON layer, and thus, the density of the trap site of the MON layer increases.

Thus, when forming the MON layer, the amount of N injected to the MON layer can be adjusted by changing the manufacturing temperature. In addition, the thermal stability of the MON layer and the density of the trap site can be effectively adjusted.

The second insulating layer 52 may also be formed of single or double layers. If a single layer, the second insulating layer 52 may be formed of an Al$_2$O$_3$ or SiO$_2$ layer having a thickness of 5 nm or more. If a double layer, the second insulating layer 52 may be formed of an Al$_2$O$_3$ layer having a thickness of about 2 nm~4 nm and an insulating layer having a thickness of about 3 nm~20 nm and high permittivity on the Al$_2$O$_3$ layer. The insulating layer having high permittivity may be formed of a HfO$_2$, ZrO$_2$, Ta$_2$O$_5$, or TiO$_2$ layer. The conductive layer 54 may be formed of a polysilicon layer which is doped with conductive impurities, or other conductive material layer, e.g., a tungsten silicide layer.

Referring to FIG. 7, stacked materials that are formed on the substrate 40 are etched in a reverse order until the substrate 40 is exposed by using the photosensitive pattern 62 as an etching mask. As a result, the gate stacked material 60, which includes the first tunneling oxide layer 48a, the memory node layer 50a, the first blocking layer 52a and the electrode layer 54a, is formed in a predetermined area of the substrate 40. The first tunneling oxide layer 48a, the memory node layer 50a, the first blocking layer 52a and the electrode layer 54a respectively result from the patterning of the first insulating layer 48, the memory node material layer 50, the second insulating layer 52, and the conductive layer 54. Then, the photosensitive pattern 62 is removed.

Referring to FIG. 8, predetermined conductive impurities, e.g., conductive impurities opposite to the impurities injected to the substrate 40 are ion-injected into the substrate 40 in a predetermined depth by using the gate stacked material 60 as a mask. Accordingly, the first and second impurities areas 42 and 44, i.e., the source and drain areas, are formed on the substrate 40 around the gate stacked material 60.

Then, a thermal process to activate the conductive impurities of the source and drain areas 42 and 44 is performed at a high temperature. While the MO layer is crystallized under this thermal process, the MON layer is maintained in an amorphous state, as confirmed by a transmission electron microscope (TEM) analysis with respect to the MO and MON layers.

Moreover, according to a surface roughness analysis using an atomic force microscope (AFM), while the MO layer has 5.3 Å surface roughness, the MON layer has 2.3 Å surface roughness. Thus, the MON layer has much less surface roughness than the MO layer.

In the meantime, a first experiment to verify the thermal stability of the SONOS memory device is performed (hereinafter, "the first experiment").

The thermal stability of the SONOS memory device according to an embodiment of the present invention is directly related to the thermal stability of stacked materials including the first insulating layer 48, the memory node material layer 50, and the second insulating layer 52.

As a particular example, the first insulating layer 48 is formed of a $SiO_2$ layer and the memory node material layer 50, i.e., the MON layer, is formed of a HfON layer in a manufacturing process of FIG. 6. In addition, the second insulating layer 52 is formed of an $Al_2O_3$ layer.

Then, as illustrated in FIG. 7, the gate stack material 60 is formed. Here, before the source and drain areas 42 and 44 are formed on the substrate 40, a gate voltage Vg is applied to the electrode layer 54a and a current-voltage characteristic (hereinafter, "a C-V characteristic") of a resulting material of the gate stacked material 60 is measured (hereinafter, "the first measurement").

After the first measurement, the resulting material of the gate stacked material 60 is annealed at 900° C. The gate voltage Vg is applied to the electrode layer 54a, and a C-V characteristic of the resulting material of the gate stacked material 60 is measured (hereinafter, "the second measurement"). As illustrated in FIG. 7, annealing of the gate stacked material 60 for the second measurement can be carried out through a process of forming the source and drain areas 42 and 44 on the substrate 40.

Figure 9:
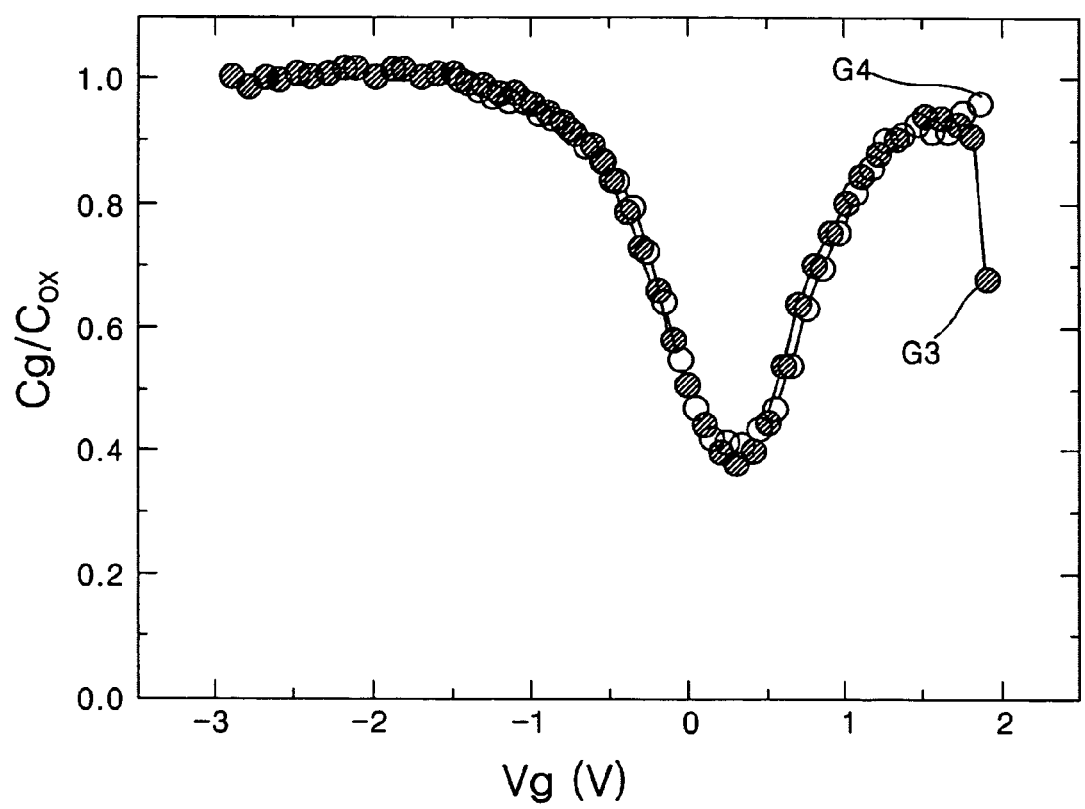
FIG. 9 is a graph illustrating a C-V characteristic of the SONOS memory device of FIG. 3.

FIG. 9 is a graph illustrating a C-V characteristic of the SONOS memory device of FIG. 3. More specifically, FIG. 9 illustrates the result of the first and second measurements.

Figure 2:
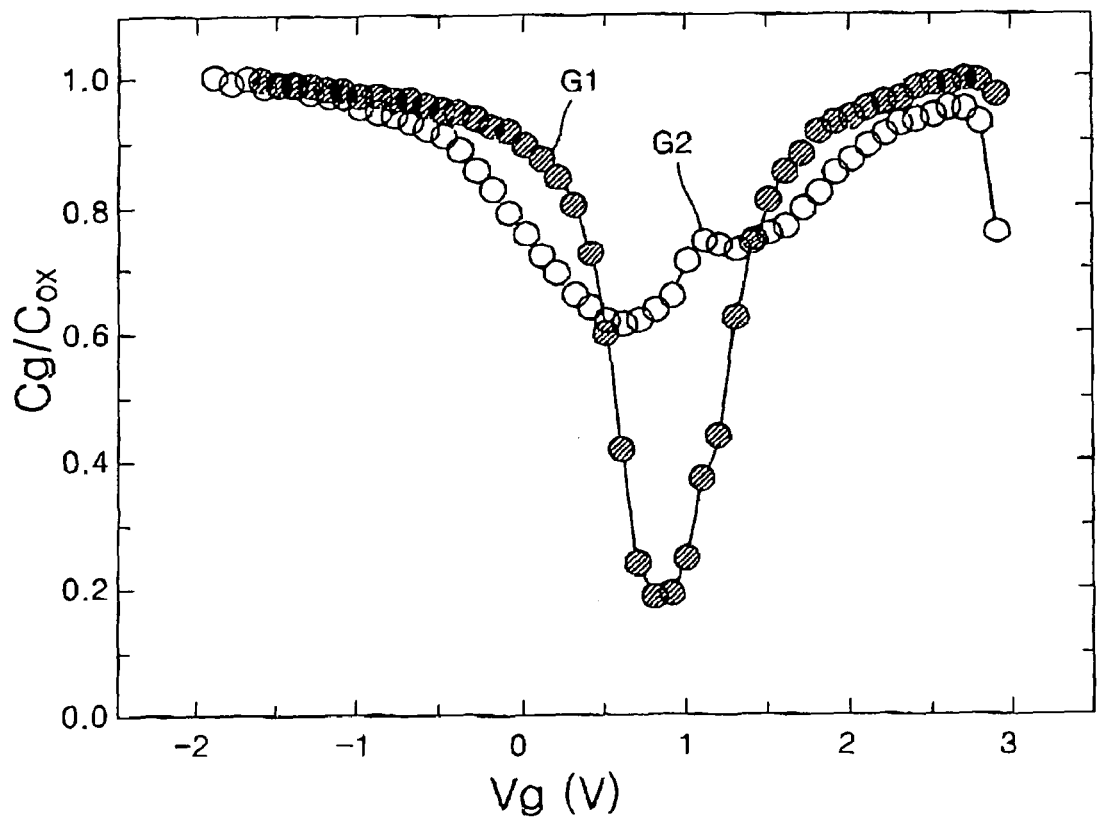
FIG. 2 is a graph illustrating a problem in a SONOS memory device including a MO stack for low voltage operations, which is suggested as an alternative to the SONOS memory device of FIG. 1.

A third graph G3 shows the result of the first measurement and a fourth graph G4 shows the result of the second measurement. As can be seen in FIG. 9, the third and fourth graphs G3 and G4 are much more closely matched than the first and second graphs G1 and G2, shown in FIG. 2, that illustrate the C-V characteristic of the conventional SONOS memory device. Thus, the SONOS memory device according to an embodiment of the present invention remains thermal stable even after the annealing.

Next, a second experiment to check changes in a flat band voltage according to a programming and erasing time (hereinafter, "the second experiment") is performed.

The second experiment is performed on a SONOS memory device of FIG. 8 (hereinafter, "the first memory device"). In the first memory device, the first tunneling oxide layer 48a, the memory node layer 50a, and the first blocking layer 52a are respectively formed of a $SiO_2$ layer, a HfON layer, and an $Al_2O_3$ layer. Next, the resulting material including the first tunneling oxide layer 48a, the memory node layer 50a, and the first blocking layer 52a is annealed at 900° C. Then, a conventional SONOS memory device (hereinafter, "the second memory device") having the first tunneling oxide layer 48a, the memory node layer 50a, and the first blocking layer 52a, which are respectively formed of a $SiO_2$ layer, a $HfO_2$ layer, and an $Al_2O_3$ layer, is compared with the first memory device.

Thereafter, changes in the flat band voltage according to a data programming time are measured with respect to the first and second memory devices (hereinafter, "the third measurement"). In the third measurement, programming and erasing voltages of about 10 V are applied.

Figure 10:
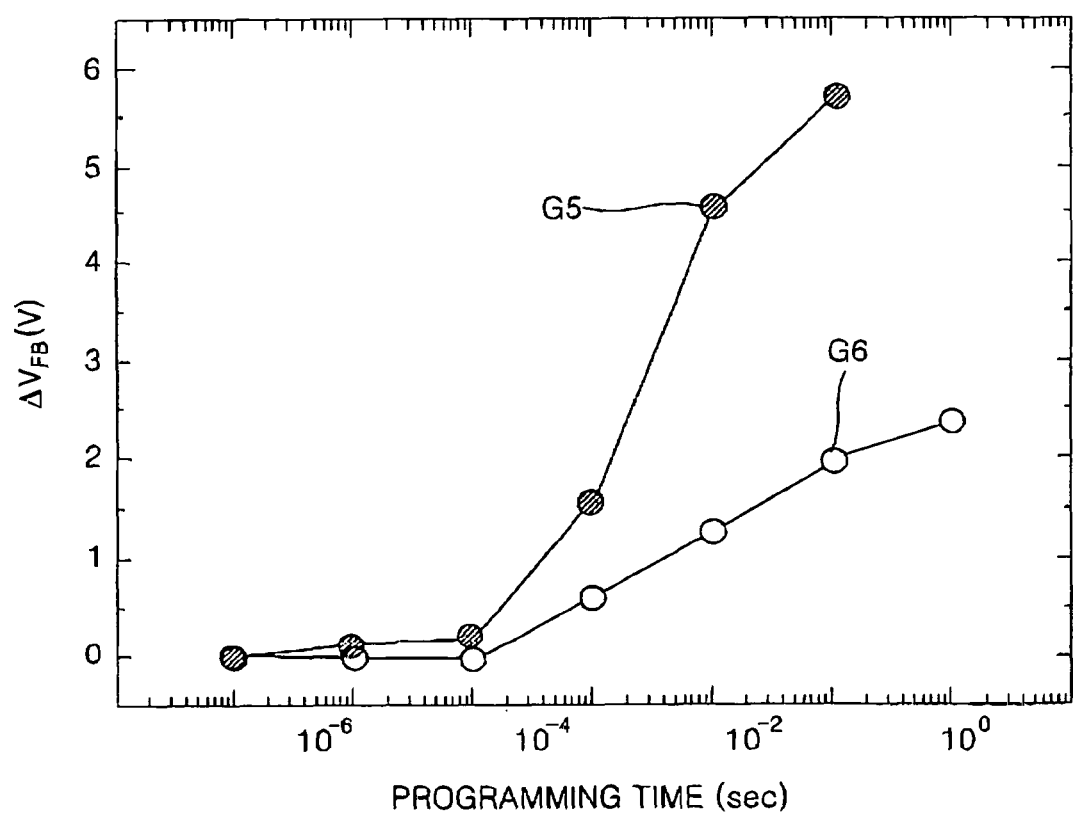
FIG. 10 is a graph illustrating changes in a flat band voltage of a memory device annealed at 900° C. depending on a data programming time according to the prior art and an embodiment of the present invention.

FIG. 10 is a graph illustrating changes in a flat band voltage of a memory device annealed at 900° C. versus a data programming time, according to the conventional SONOS memory device and an embodiment of the present invention. More specifically, FIG. 10 illustrates the result of the third measurement.

A fifth graph G5 illustrates the result of the third measurement with respect to the first memory device and a sixth graph G6 illustrates the result of the third measurement with respect to the second memory device.

Comparing the fifth and sixth graphs G5 and G6, a change or shift in the flat band voltage Vfb according to the data programming time is much larger in the fifth graph G5. In the fifth graph G5, while changes in the data programming time are very small, the flat band voltages greatly increase. This indicates that data can be adequately recorded while the programming time is changed. Therefore, the data programming time can be set to be much shorter in the first memory device than in the second memory device.

Then, changes in the flat band voltage with respect to the first and second memory devices according a data erasing time are measured (hereinafter, "the fourth measurement").

Figure 11:
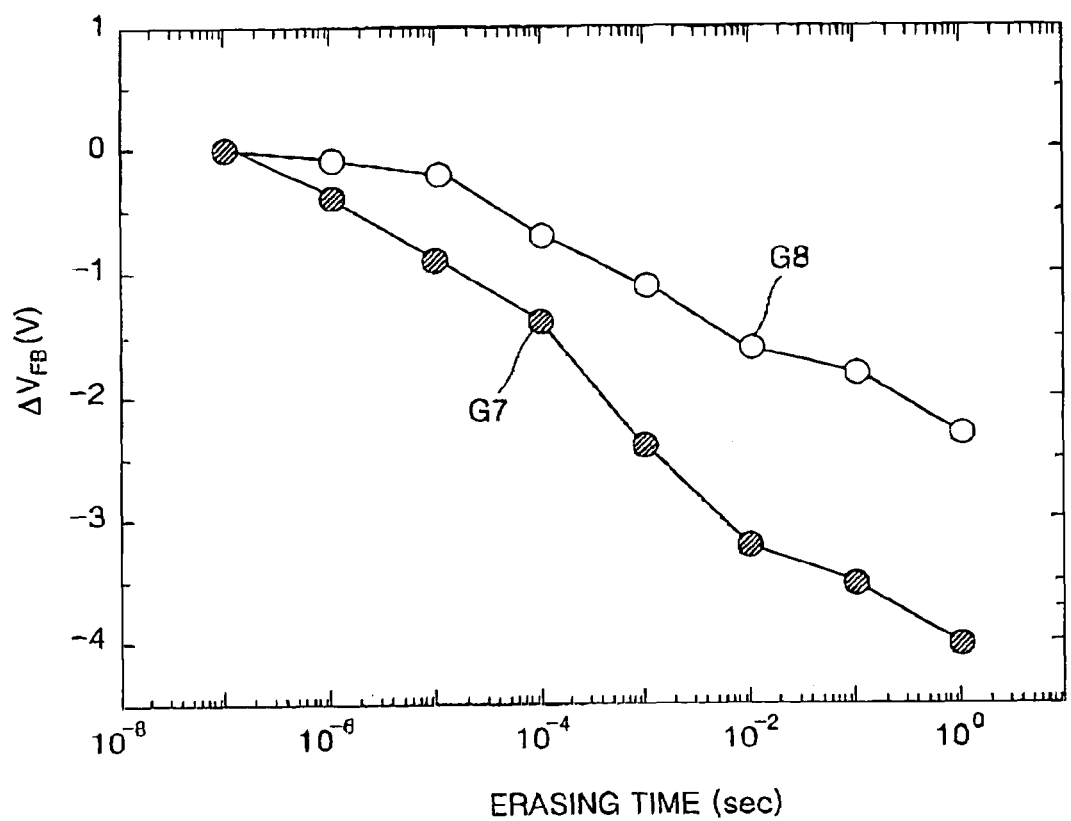
FIG. 11 is a graph illustrating changes in a flat band voltage of a memory device annealed at 900° C. depending on a data erasing time according to the prior art and an embodiment of the present invention.

FIG. 11 is a graph illustrating changes in a flat band voltage of a memory device annealed at 900° C. versus a data erasing time according to a conventional SONOS memory device and an embodiment of the present invention. More specifically, FIG. 11 illustrates the result of the fourth measurement.

A seventh graph G7 illustrates the result of the fourth measurement with respect to the first memory device and an eighth graph G8 illustrating the result of the fourth measurement with respect to the second memory device.

Comparing the seventh and eighth graphs G7 and G8, a change or shift in the flat band voltage Vfb according to the data erasing time is much larger in the seventh graph G7. That is, as the erasing time increases, the flat band voltage Vfb in the seventh graph G7 decreases much more than that in the eighth graph G8.

This indicates that the erasing time of the memory device applied to the seventh G7 is much shorter than the eighth graph G8, and thus, the erasing time of the first memory device can be set much shorter than that of the second memory device.

As described above, the SONOS memory device according to preferred embodiments of the present invention includes a MON or MSiON layer having high permittivity as the memory node layer. Therefore, the memory node layer is maintained in an amorphous state during general MOS processes performed at a high temperature. By using the SONOS memory device according to preferred embodiments of the present invention, the thermal stability is secured as illustrated in FIG. 9. In addition, as seen from changes in the flat band voltage according to the data programming and erasing time in FIGS. 10 and 11, the data programming and erasing time can be reduced. Thus, a data processing speed is greatly increased in comparison to the conventional method and a retention characteristic is properly maintained. Furthermore, the density of the trap site of the memory node layer is increased and the lowering of the retention characteristic due to an increase of the surface roughness and mixing of materials respectively forming the memory node layer and the blocking layer due to out-diffusion are prevented.

The present invention may, however, be embodied in many different forms and should not be construed as being limited to the embodiments set forth herein; rather these embodiments are provided so that this disclosure will be thorough and complete, and will fully convey the concept of the invention to those skilled in the art. For instance, one skilled in the art may form a heterogeneous memory node layer between the first tunnelling oxide layer 48a and the memory node layer 50a and/or between the memory node layer 50a and the first blocking layer 52a.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory device, comprising:
a substrate; and
a multifunctional device formed on the substrate, the multifunctional device providing switching and data storing functions and including a memory node layer, wherein the memory node layer includes an amorphous-remaining material layer including metal and nitrogen, and the amorphous-remaining material remains amorphous when exposed to a temperature of about 900° C. or more.

2. The memory device as claimed in claim 1, wherein the multifunctional device comprises:
first and second impurities areas;
a channel formed between the first and second impurities areas; and
a stacked material formed on the channel for data storage, wherein the first and second impurities areas and the channel are formed on the substrate.

3. The memory device as claimed in claim 2, wherein the stacked material for data storage is formed by sequentially stacking a first tunneling oxide layer, the memory node layer in which data is stored, a first blocking layer, and an electrode layer.

4. The memory device as claimed in claim 3, wherein a second tunneling oxide layer is further formed between the first tunneling oxide layer and the memory node layer.

5. The memory device as claimed in claim 4, wherein the second tunneling oxide layer is an aluminum oxide ($Al_2O_3$) layer.

6. The memory device as claimed in claim 3, wherein a second blocking layer is further formed between the first blocking layer and the electrode layer.

7. The memory device as claimed in claim 6, wherein the second blocking layer is formed of an hafnium oxide ($HfO_2$), zirconium oxide ($ZrO_2$), tantalum oxide ($Ta_2O_5$) or titanium oxide ($TiO_2$) layer.

8. The memory device of claim 3, wherein the memory node layer is a metal-oxide-nitride (MON) or a metal-silicon-oxide-nitride (MSiON) layer.

9. The memory device as claimed in claim 8, wherein the metal is hafnium (Hf), zirconium (Zr), tantalum (Ta), titanium (Ti), aluminium (Al), or a lanthanide (Ln), where the Ln is lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

10. The memory device as claimed in claim 8, wherein the MON or MSiON layer contains nitrogen (N) of about 1 atomic %~80 atomic %.

11. The memory device as claimed in claim 3, wherein the first tunneling oxide layer is a silicon oxide ($SiO_2$) layer.

12. The memory device as claimed in claim 3, wherein the first blocking layer is an aluminum oxide ($Al_2O_3$) or $SiO_2$ layer.

13. A memory device, comprising:
a substrate; and
a multifunctional device formed on the substrate, the multifunctional device adapted to provide switching and data storing functions and including:
a stacked structure on the substrate, the stacked structure including a first tunneling oxide layer, a memory node layer, a first blocking layer and a gate electrode layer, wherein the memory node layer includes an amorphous-remaining material layer including metal and nitrogen, and the amorphous-remaining material remains amorphous when exposed to a temperature of about 900° C. or more.

14. The memory device as claimed in claim 13, wherein a second tunneling oxide layer is arranged between the first tunneling oxide layer and the memory node layer.

15. The memory device as claimed in claim 14, wherein the second tunneling oxide layer is an aluminum oxide ($Al_2O_3$) layer.

16. The memory device as claimed in claim 13, wherein a second blocking layer is arranged between the first blocking layer and the gate electrode layer.

17. The memory device as claimed in claim 16, wherein the second blocking layer includes at least one of an hafnium oxide ($HfO_2$), zirconium oxide ($ZrO_2$), tantalum oxide ($Ta_2O_5$) and titanium oxide ($TiO_2$) layer.

18. The memory device as claimed in claim 17, wherein the metal is hafnium (Hf), zirconium (Zr), tantalum (Ta), titanium (Ti), aluminium (Al), or a lanthanide (Ln), where the Ln is lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

19. The memory device of claim 13, wherein the memory node layer is a metal-oxide-nitride (MON) or a metal-silicon-oxide-nitride (MSiON) layer.

20. The memory device as claimed in claim 13, wherein the first tunneling oxide layer is a silicon oxide ($SiO_2$) layer.

21. The memory device as claimed in claim 13, wherein the first blocking layer is an aluminum oxide ($Al_2O_3$) or $SiO_2$ layer.

* * * * *